United States Patent [19]

Maas et al.

[11] Patent Number: 4,933,769
[45] Date of Patent: Jun. 12, 1990

[54] PICTURE DISPLAY DEVICE INCLUDING A STAIRCASE GENERATOR

[75] Inventors: Johannes A. A. G. Maas; Hendrik Ten Pierick, both of Eindhoven, Netherlands

[73] Assignee: U.S. Philips Corporation, New York, N.Y.

[21] Appl. No.: 278,705

[22] Filed: Dec. 1, 1988

[30] Foreign Application Priority Data

Dec. 7, 1987 [NL] Netherlands .................. 8702935

[51] Int. Cl.$^5$ .................. H03K 4/72; H04N 5/44
[52] U.S. Cl. .................. 358/230; 358/188; 315/367
[58] Field of Search .................. 315/367, 370, 371; 358/188, 230, 242; 328/185, 186

[56] References Cited

U.S. PATENT DOCUMENTS

| | | | |
|---|---|---|---|
| 4,581,585 | 8/1986 | Bristol | 328/185 |
| 4,617,495 | 10/1986 | Culter | 315/368 X |
| 4,638,308 | 1/1987 | Kuwabara et al. | 340/736 |
| 4,677,350 | 6/1987 | Wharton et al. | 315/371 |
| 4,689,526 | 8/1987 | Schweer | 358/242 |
| 4,761,586 | 8/1988 | Wharton | 315/371 X |
| 4,782,269 | 11/1988 | Haferl | 315/371 |

Primary Examiner—James J. Groody
Assistant Examiner—Mark R. Powell
Attorney, Agent, or Firm—Edward W. Goodman

[57] ABSTRACT

A picture display device includes a generator for generating a periodical staircase-shaped signal for addressing picture elements on display screen. The initial value of the staircase shape is settable and a stepwise change takes place each time upon the occurrence of clock pulses. The height of the steps is determined by the following measures:

measuring the value of the staircase shape at a predetermined measuring instant or measuring the instant when the staircase shape is at a predetermined level, comparing the measured quantity with a predetermined target value, deriving a new value from this comparison and from the set initial value for the height of the steps of the staircase shape, for which new value the difference between the measured quantity and the target value has a predetermined value, and setting the height of the steps of the staircase shape at this new value.

7 Claims, 2 Drawing Sheets

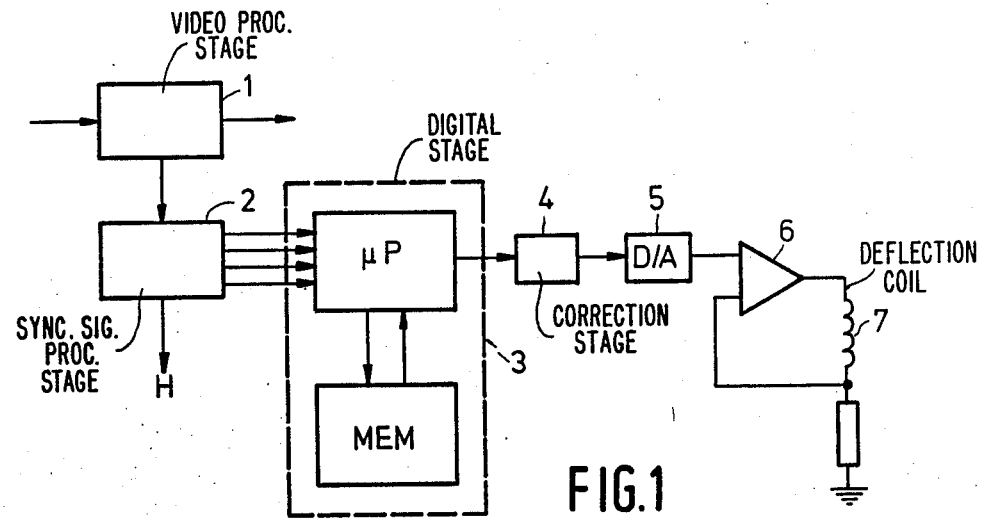

FIG.1

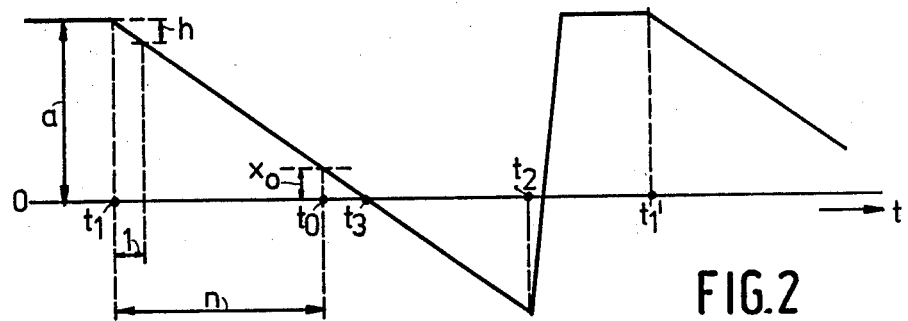

FIG.2

```
┌─────────────┐
│ RESET FIELD │
└──────┬──────┘
       │
┌──────┴──────┐
│ h':=h* a/(a-x₀) │─31
└──────┬──────┘
       │
┌──────┴──────┐
│   h:=h'     │─32
└──────┬──────┘
       │
┌──────┴──────┐
│  x:=a+h     │─33
└──────┬──────┘
       │
   ┌───┴────┐
   │ RETURN │
   └────────┘
```

FIG.3a

```
┌────────────┐
│ LINE START │
└──────┬─────┘
       │
┌──────┴──────┐
│  x:=x-h     │─34
└──────┬──────┘
       │
   ┌───┴────┐
   │ RETURN │
   └────────┘
```

FIG.3b

```
┌───────────┐
│ REFERENCE │
└─────┬─────┘
      │
┌─────┴─────┐
│ 35  x:=x₀ │
└─────┬─────┘
      │
  ┌───┴────┐
  │ RETURN │
  └────────┘
```

FIG.3c

PICTURE DISPLAY DEVICE INCLUDING A STAIRCASE GENERATOR

BACKGROUND OF THE INVENTION

1. Field of the Invention

The invention relates to a picture display device suitable for receiving a video signal comprising picture information, line and field, synchronizing signals and line and field blanking signals, and for displaying the picture information on a display screen, said device including a generator for generating a periodical staircase-shaped signal for addressing picture elements of the display screen, said signal varying each time upon the occurrence of a periodical clock pulse from a settable initial value upon the occurrence of a start signal and having a stepwise change which is also settable, and subsequently assuming the initial value again under the influence of a reset signal.

2. Description of Related Art

A picture display device of this type is known from European patent application No. 112416. For generating a staircase-shaped signal for the field deflection in a picture display tube, the staircase generator in this known device includes a capacitor which is charged during the occurrence of line frequency clock pulses and is discharged during the occurrence of field frequency reset pulses. The device comprises means for manually setting both the initial value of the staircase shape, i.e. the level of the first horizontally extended step in the field period, and the height of the vertical steps. If the number of clock pulses, hence the number of steps during the field period, is given, the entire staircase shape and particularly its amplitude is wholly determined.

A drawback of the staircase generator in the known device is that some parts of the generator have properties which are dependent on temperature so that the quality envisaged for the displayed picture is not obtained. This drawback is recognized by the Applicant of the above-mentioned European application in a subsequent application, namely in European patent application No. 123,745 in which an improved circuit arrangement is proposed for reducing the temperature dependence.

SUMMARY OF THE INVENTION

The object of the present invention is to provide an improved picture display device of the type described above in which a high quality is obtained, and in which the height of the vertical steps is not set manually but automatically. To this end a picture display device according to the invention is characterized in that the staircase generator is adapted to carry out the following technical measures:

measuring the value of the staircase shape at a predetermined measuring instant, or measuring the instant when the staircase shape is at a predetermined level, comparing the measured quantity with a predetermined target value, deriving a new value from this value and from the set initial value for the height of the steps of the staircase shape, for which new value the difference between the measured quantity and the target value has a predetermined value, and setting the height of the steps of the staircase shape at this new value.

The invention is based on the recognition that for a given initial value, there is a relationship between the value of the staircase shape at a given measuring instant and the height of the steps. Thus, if the measure according to the invention ensures that the height of the steps has the desired value, the entire staircase shape is determined automatically and accurately, while temperature effects and other effects, for example, aging of components, which might cause variations have very little influence. Moreover, it can be ensured that there is a given relation between the staircase shape obtained and the picture information to be displayed.

As a rule, the number of clock pulses will be large so that the height of the separate steps is small as compared with the amplitude of the staircase shape which therefore may be considered to be a shape approximating a sawtooth shape. The sawtooth shape has a slope which is determined by the height of the steps. In this respect it is to be noted that British patent application No. 2134732A describes a slope-controlled sawtooth generator in which the slope of a sawtooth-shaped voltage generated across a capacitor is controlled as a function of time, requiring this voltage to reach a second reference level from a first reference level. This process is repeated a number of times until the difference with the target value has become sufficiently small. In the staircase generator according to the invention, the height of the steps of the staircase shape is adjusted in one operation so as to realize that the staircase shape assumes the desired value at the desired instant. The device according to the invention is preferably characterized in that the start signal occurs at the initial instant and the reset signal occurs at the final instant of the display of the picture information to be displayed, the new value of the height of the steps of the staircase shape being derived for displaying the picture information at the central instant between the two signals in the picture element in the display screen center. However, in this case it is assumed that the central instant between the start signal and the reset signal is determined with certainty, which is not always true.

If a new value deviating from the previous value is derived for the height of the steps, the sawtooth shape assumes a new slope. The sawtooth shape shows a kink which may be visible. This may be undesirable. The device according to the invention is therefore preferably characterized in that the staircase generator has a memory for storing the new value found and for setting the height of the steps of the staircase shape at this new value at the instant of occurrence of the first start signal after measurement.

A given relation with the picture information to be displayed is obtained if the device is further characterized in that the start signal occurs at the initial instant of the display of the picture information to be displayed, at which instant the first horizontally extended step of the staircase shape is generated, while the height of the steps of the staircase shape is set for the coming period.

In an embodiment in which the picture display device comprises a synchronizing signal processing stage for processing the synchronizing pulses in the received video signal and for generating local line and field signals which are substantially synchronous with the corresponding signals in the received video signal, the picture display device is characterized in that the repetition frequency of the staircase-shaped signal is the frequency of the local field signal, the frequency of the clock pulses being equal to the frequency of the local line signal, the start signal, the reset signal and the clock pulses originating from the synchronizing signal processing stage, which applies a measuring pulse to the staircase generator at the measuring instant. The measure according to the invention is thus used for the field deflection.

The invention need not be limited thereto. In another embodiment, in which the picture display device comprises a synchronizing signal processing stage for processing the synchronizing pulses in the received video signal and for generating a line signal which is substantially synchronous with the line signal in the received video signal, the picture display device is characterized in that the repetition frequency of the staircase-shaped signal is the frequency of the local line signal, the frequency of the clock pulses being a multiple of said line frequency, the start signal, the reset signal and the clock pulses originating from the synchronizing signal processing stage, which applies a measuring pulse to the staircase generator at the measuring instant. The measure according to the invention is thus used for the line deflection.

BRIEF DESCRIPTION OF THE DRAWINGS

The invention will now be described in greater detail, by way of example, with reference to the accompanying drawings, in which:

FIG. 1 shows a part of a picture display device according to the invention:

FIG. 2 shows a time diagram to explain the operation of the staircase generator in the picture display device of FIG. 1; and FIGS. 3A to 3C and FIGS. 4A to 4C show flow charts to explain the operation of the staircase generator of FIG. 1.

DESCRIPTION OF THE PREFERRED EMBODIMENT

Figures 4A, 4B, 4C:
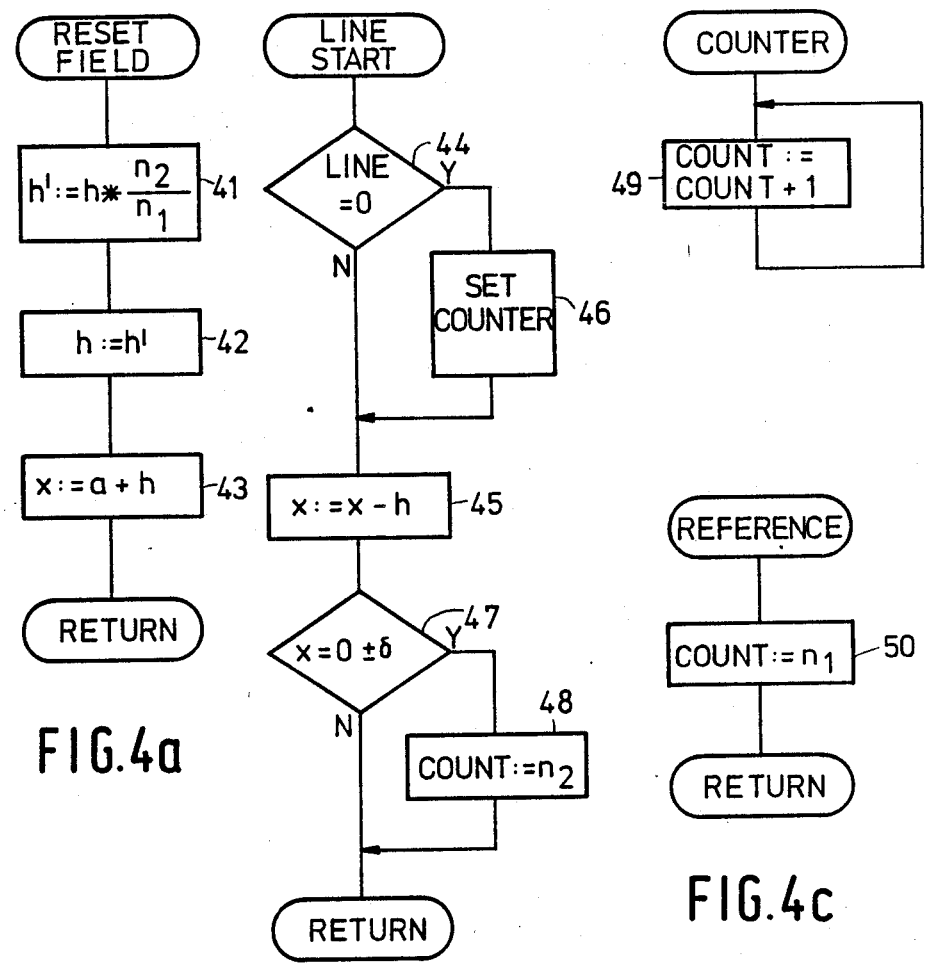

The picture display device of FIG. 1 comprises a video processing stage 1 receiving an incoming video signal comprising picture information, line and field synchronizing signals, and line and field blanking signals. The picture information is processed in known manner in stage 1 for display on the display screen of a picture display tube (not shown). Stage 1 applies a synchronizing signal to a synchronizing signal processing stage 2 of known type in which the synchronizing pulses in the incoming video signal are processed and in which local line and field signals are generated which are substantially synchronous with the corresponding signals in the incoming video signal. The line signals are further processed for the horizontal deflection H in the picture display tube. The field (vertical) deflection in the picture display tube is ensured by a digital stage 3 which receives signals from stage 2 and which generates a digital signal, a correction stage 4 which further processes this signal, subsequently a digital-to-analog converter 5 and finally a power stage 6 applying a deflection current to a field deflection coil 7 connected to an output of stage 6. Stages 3 and 4 and converter 5 constitute a staircase generator for generating an analog staircase-shaped signal. In known manner, and particularly by the use of negative feedback, stage 6 is constituted as a linear amplifier. This would give the field deflection current a staircase shape. However, if the number of steps in the staircase shape is large, the current varies continuously, more specifically because of the integrating operation of the amplifier which behaves as a low-pass filter, and of the deflection coil. Under these circumstances, the variation of the current is essentially sawtooth-shaped.

Stage 2 applies to stage 3 a field frequency start signal, a field frequency reset signal and line frequency clock pulses. If correction stage 4 is initially left outside consideration, the signal at the output of converter 5 has a variation as a function of time which is indicated as an approximation in FIG. 2. Due to the large number of steps of the generated staircase shape, the height of each step is small as compared with the total amplitude of the staircase shape and the waveform of FIG. 2 can be considered as an essentially linear sawtooth shape. Its repetition frequency is equal to the field frequency.

The start signal occurs at an instant $t_1$. Stage 2 comprises a frequency divider circuit for dividing the line frequency by a given number so that signals of the field frequency are obtained. At instant $t_1$, the first active line period in the field begins, i.e. after the field blanking interval the first line period in which picture information is displayed. At this instant, the first horizontally extended step of the staircase shape is generated with a settable initial level a. Subsequently, the occurrence of each clock pulse causes a variation so that the level of the signal is each time changed in the same, given direction, for example, assuming a lower value. This variation is preferably effected during the line blanking interval following the display of the picture information of a line, and is thus invisible. During the active part of the line period, in which picture information is received, the level of the signal remains unchanged. In this way a falling staircase shape is produced in which all vertical steps have the same height. During each horizontally extended step of the staircase shape the picture information is displayed on the display screen in accordance with a horizontal line. By setting the level a, the location of the first line is set at the upper edge of the display screen. The period between the start pulse and the first clock pulse and the period between the clock pulses themselves are equal to the duration of one line period, i.e. for example 64 μs in accordance with the European television standard. According to this standard, each field has 312.5 lines. Instant $t_1$ occurs, for example, after the first 24 lines of the field. There are 288.5 active lines per field and the staircase-shaped signal has 288 vertical steps. The 289th and last horizontally extended step corresponding to the last line of picture information has a period which is equal to half the period of a line because the reset signal occurs at an instant $t_2$ which is located 32 μs after the start of the last line period. Under the influence of the reset signal, the level of the staircase shape again assumes the value a and remains unchanged until an instant $t'_1$ which occurs one field period, i.e. 20 ms in this example, later than instant $t_1$. At instant $t'_1$ a new start signal introduces a new falling staircase shape.

The sawtooth shape of FIG. 2 crosses the zero axis at an instant $t_3$ between instants $t_1$ and $t_2$. Before instant $t_3$ the deflection current flows through coil 7 in a given direction, whereafter this current flows in the opposite direction. Actually, instant $t_3$, corresponds to an area of the staircase shape. If the start level a and the height of the separate steps have arbitrary values, instant $t_3$ will generally not coincide with the central instant $t_0$ of the interval between instants $t_1$ and $t_2$. However, it is desirable for the sawtooth shape to cross the zero axis at instant $t_0$ in order that the picture information of the center of the active part of the field is displayed at the same moment when the center of the display screen is scanned. In other words, the picture information of the central active line has to be displayed on the central horizontal line of the screen.

At instant $t_0$, i.e. during the 145th line period after instant $t_1$ in this example, stage 2 applies a measuring pulse to stage 3. During the occurrence of the measuring pulse, the level $x_0$ of the 145th horizontally extended step is determined. If the number of line periods between instants $t_1$ and $t_0$ is generally given by a number n, i.e. 144 in the example described, it is apparent from FIG. 2 that the height of the steps is equal to $$h = \frac{a - x_0}{n}.$$

For a sawtooth shape which crosses the zero axis at the point $t_0$ from the same initial value a, the height of the steps is equal to $h' = a/n$. It follows that $$h' = h \times \frac{a}{a - x_0}. \quad (1)$$

In formula (1) $h'$ does not depend on the number n.

Stage 3 is formed with the aid of a control circuit comprising a microprocessor $\mu P$ and a memory MEM. The microprocessor is programmed to calculate the value $h'$ in accordance with formula (1) and to apply the value found to the memory in which $h'$ is stored until the instant $t'_1$. After this instant, the staircase-shaped signal acquires a decreasing variation upon the occurrence of the first clock pulse, which variation is equal to the new value $h'$. It will be clear from the foregoing that the new sawtooth shape crosses the zero axis at the point $t'_0$ which is one field period later than instant $t_0$ so that at the next measurement, no deviation with respect to the desired value is measured. The sawtooth shape obtained is symmetrical with respect to the central point of the picture information and at the final instant of the display of the picture information, the level reached is equal to $-a$ which corresponds to the lower edge on the display screen. The amplitude of the sawtooth shape is 2a. Thus, with the setting of a, the amplitude of the displayed picture is set.

It has actually been assumed in the foregoing that the target value of deviation $x_0$ at instant $t_0$ is zero. The reason is that the nubmer of steps in the example dealt with is an even number. If there is an odd number of steps, the target value of $x_0$ is not equal to zero, but to $x = h'/2$ so that the new height $h'$ of the steps satisfies the relation $$h' = \frac{a - h'/2}{n}$$

and is thus equal to $$\frac{a}{n + \frac{1}{2}}.$$

In this case, n is equal to half the number of steps rounded off downwards to the nearest integer. It follows that $$h' = h \times \frac{n}{n + 1} \times \frac{a}{a - x_0} \quad (2)$$

In this formula, in which $h'$ does depend on n, the factor $n/n+1$ deviates very little from 1 so that the centering error produced by using formula (1) is very small. It will be clear that the microprocessor may be programmed in such a way that formula (1) applies in the case of an even number of steps and formula (2) applies in the case of an odd number of steps. In practice $x_0$ cannot have the value of zero, but at least the value of the smallest bit so that the desired sawtooth shape is only obtained with a given approximation.

It may be noted that in the steady state of the circuit arrangement, the deviation $x_0$ measured at instant $t_0$ will be small so that the height of the steps can be given the new value $h'$ already upon the occurrence of the clock pulse occurring immediately after instant $t_0$. From this instant the sawtooth shape acquires a new slope which deviates little from the slope before instant $t_0$. In this case the storage time for $h'$ is very short.

It will also be noted that it has been assumed in the foregoing that the central horizontal line is scanned on the display screen when the field deflection current is zero, resulting in the sawtooth shape of FIG. 2 crossing the value of zero in the center of the picture information. However, in practice a deviation may occur with respect to this ideal situation, for example, due to tolerances, at which the level of the horizontally extended step of the staircase shape corresponding to the central horizontal line should therfore have a predetermined value which need not be exactly zero.

The field deflection circuit described is suitable for video signals with different line numbers and/or field frequencies. If a change-over is effected to a signal in accordance with a different television standard, a staircase shape is generated which generally has a different number of steps and a different duration of the field period. This may be ensured by a change-over of known type in which the setting of the initial value a is maintained. For displaying an interlaced picture, a distinction should be made in known manner between the various fields constituting a picture. In the case of a 2:1 interlace, stage 2 applies a signal of the picture frequency to stage 3 so that every other field a level is subtracted from the initial value of the generated staircase shape, which level is equal to half the height of a step. This implies that the entire staircase shape is shifted downwards by $h'/2$ and that the value to be reached at instant $t_0$ is also decreased by $h'/2$. The control procedure described for minimizing the deviation $x_0$ is, however, simplified because the procedure is only carried out every other field, for example during those fields in which the target value at instant $t_0$ is nearest to zero. In the case of an m:1 interlace, in which m is an integer, the control procedure is carried out every other m fields.

If the incoming video signal is not a standard signal or if the line number per field is variable, the central instant $t_0$ cannot be determined with certainty. A variable line number may occur when receiving video recorder signals. It is therefore better to choose a given line in the field period as a reference line, while the level of the horizontally extended step corresponding to this line is brought to a substantially predetermined value by means of the procedure described. Consequently, the reference line is fixed or the display screen, and since the height of the steps is derived in the correct manner, all other lines, with the exception of the very last lines, are also fixed with respect to the picture information to be displayed. This eliminates the necessity of a centering device. Such a centering device, whose setting may vary with time, may introduce linearity errors which must be corrected. Moreover, a centering device is not suitable for different standards.

The previous description applies to the case in which the digital signal generated by stage 3 would be directly applied to converter 5. Corrections for rendering the digital signal suitable for the field deflection are made with the correction stage 4. Such a correction is the S-correction by which the linear sawtooth shape of FIG. 2 is converted to a predetermined S shape. The result of the correction is that the height of the vertical steps continuously increases in accordance with a predetermined function of time in the first half of the period until instant $t_0$ and decreases after instant $t_0$, the location of the zero crossing of the staircase shape remaining unchanged. It will be clear that stage 4 can be dispensed with because the variation caused thereby may be incorporated in the program of the microprocessor.

Similarly as for the described field deflection generator, a staircase-shaped signal can be generated for the line deflection. In this case the repetition frequency of this signal is the line frequency and the clock pulses have a frequency which is a multiple of the line frequency. The horizontal lines are not continuously written on the display screen, but stepwise. One condition is that there are at least as many points per line as there are video samples. At the instant after the line blanking interval at which picture information is displayed, the start pulse occurs and the reset pulse occurs at the instant when the picture information is discontinued before the following line blanking. The measuring pulse occurs at a reference instant which is located between the afore-mentioned instants.

In the foregoing, the microprocessor is programmed for the field variation in such a way that a horizontally extended step of the staircase shape is brought to a given level at a given instant in the field period, for example $t_0$. The microprocessor can be programmed differently in such a way that the instant when a given level is reached is measured. This requires a second clock pulse source having a higher frequency that the line frequency clock pulses with which the steps of the staircase shape are generated. If, for example, the zero level is chosen, a number of $n_1$ of the second clock pulses occur between instants $t_1$ and $t_0$. The zero crossing of the sawtooth shape is effected at instant $t_3$ and $n_2$ second clock pulses occur between instants $t_1$ and $t_3$. The height of the steps is then proportional to $a/n_2$. If either from instant $t_3$ or from instant $t'_1$ the height is given the value h' which is proportional to $a/n_1$, the zero crossing will be effected substantially at instant $t'_0$ during the next field period. As a function of h the new value is given by $$h' = h \times \frac{n_2}{n_1} \quad (3)$$

h' may also be derived from the time difference between instants $t_0$ and $t_3$. It will be clear that the level at which the time is measured need not be zero, but may be arbitrarily chosen. It is true that this method is more accurate than the previously described method, but its drawback is that it requires a higher clock frequency which may not be available.

The program for the previously described method for the field deflection comprises three sub-programs whose flow charts are shown in FIG. 3 for the field deflection. The first sub-program (3a) is started by the occurrence of a field reset pulse. In a step 31 the new value h' of the height of a vertical step is calculated in accordance with formula (1) with reference to the values of a, the old value h of the height and $x_0$ which are taken from the memory. In a step 32 the new value h' is assigned to the height h and in a step 33 the value $a+h$ is assigned to the level x, which value becomes available. The second sub-program (3b) is each time started by the occurrence of a line frequency clock pulse, and in a step 34 the level x is decreased by the value h and the obtained value $x-h$ becomes available. Finally, the third sub-program (3c) comprises a step 35 in which the value $x_0$ assumed by the variable x upon the occurrence of the measuring pulse is applied to the memory.

FIG. 4 shows the flow charts of the four sub-programs comprised in the programs for the second method described for the field deflection. The first sub-program (4a) comprises three steps 41, 42 and 43, steps 42 and 43 being identical to the steps 32 and 33 in FIG. 3a and the new value h' being calculated in step 41 in accordance with formula (3). The second sub-program (4b), which is started by the occurrence of a line frequency clock pulse, comprises a step 44 in which it is checked whether the line number is zero. If this is not the case, the value $x-h$ is assigned to the level x in a step 45. Otherwise a counter is set in a step 46, whereafter a transfer is made to step 45. In a step 47 it is checked whether x substantially has the value of zero and, if so, the value $n_2$ to be applied to the memory is assigned to the count of the counter in a step 48. Otherwise the second sub-program will end. The third sub-program (4c) comprises only one step 49 in which the count of the counter is increased by 1 and finally in a step 50 of the fourth sub-program (4d) the value $n_1$ to be applied to the memory is assigned to the count of the counter upon the occurrence of the measuring pulse.

The foregoing description gives examples of deflection circuits in accordance with the principle of the invention. It will be evident that variants can be received which are within the scope of the invention. It may be noted that the described circuits, with the exception of the output stages and the deflection coils, may alternatively be used in picture display devices in which the picture display is not based on the deflection and the impingement of an electron beam in a cathode ray tube, but on addressing luminescing picture elements, for example, liquid crystals. Deflection may also be considered as addressing picture elements of a display screen.

What is claimed is:

1. A picture display device suitable for receiving a video signal comprising picture information, line and field synchronizing signals and line and field blanking signals, and for displaying the picture information on a display screen, said device including a generator for generating a periodical staircase-shaped signal for addressing picture elements of the display screen, said signal varying each time upon the occurrence of a periodical clock pulse from a settable initial value upon the occurrence of a start signal and having a stepwise change which is also settable, and subsequently assuming the initial value again under the influence of a reset signal, characterized in that the staircase generator comprises:

means for measuring the value of the staircase shape at a predetermined measuring instant or for measuring the instant when the staircase shape is at a predetermined level;

means for comparing the measured quantity with a predetermined target value;

means for deriving a new value from said comparison and from the set initial value for the height of the steps of the staircase shape, for which new value the difference between the measured quantity and the target value has a predetermined value; and means for setting the height of the steps of the staircase shape at said new value.

2. A picture display device as claimed in claim 1, characterized in that said picture display device comprises means for generating the start signal at the initial instant and the reset signal at the final instant of the display of the picture information to be displayed, said deriving means deriving the new value of the height of the steps of the staircase shape for displaying the picture information at the central instant between the start and reset signals in the picture element in the display screen center.

3. A picture display device as claimed in claim 1, characterized in that the staircase generator has a memory for storing the derived new value, and said setting means sets the height of the steps of the staircase shape at this new value at the instant of occurrence of the first start signal after the measurement by said measuring means.

4. A picture display device as claimed in claim 3, characterized in that said generating means generates the start signal at the initial instant of the display of the picture information to be displayed, at which instant the first horizontally extended step of the staircase shape is generated, while said setting means sets the height of the steps of the staircase shape for the coming period.

5. A picture display device as claimed in claim 4, comprising a synchronizing signal processing stage for processing the synchronizing pulses in the received video signal and for generating local line and field signals which are substantially synchronous with the corresponding signals in the received video signal, characterized in that the repetition frequency of the staircase-shaped signal is the frequency of the local field signal, the frequency of the clock pulses being equal to the frequency of the local line signal, wherein the start signal, the reset signal and the clock pulses are generated by the synchronizing signal processing stage which applies a measuring pulse to the generator at the measuring instant.

6. A picture display device as claimed in claim 5, suitable for receiving and displaying an interlaced video signal having an m:1 interlace, in which m is an integer, the staircase shapes generated during various field periods being vertically shifted with respect to one another, characterized in that said synchronizing signal processing stage generates the measuring pulse every other m fields.

7. A picture display device as claimed in claim 4, comprising a synchronizing signal processing stage for processing the synchronizing pulses in the received video signal and for generating a line signal which is substantially synchronous with the line signal in the received video signal, characterized in that the repetition frequency of the staircase-shaped signal is the frequency of the local line signal, the frequency of the clock pulses being a multiple of said line frequency, wherein the start signal, the reset signal and the clock pulses are generated by the synchronizing signal processing stage which applies a measuring pulse to the generator at the measuring instant.

* * * * *